(12) United States Patent
Botula et al.

(10) Patent No.: US 9,847,415 B2
(45) Date of Patent: Dec. 19, 2017

(54) FIELD EFFECT TRANSISTOR AND METHOD OF MANUFACTURE

(71) Applicant: INTERNATIONAL BUSINESS MACHINES CORPORATION, Armonk, NY (US)

(72) Inventors: Alan B. Botula, Essex Junction, VT (US); Alvin J. Joseph, Williston, VT (US); Stephen E. Luce, Underhill, VT (US); John J. Pekarik, Underhill, VT (US); Yun Shi, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 168 days.

(21) Appl. No.: 14/523,076

(22) Filed: Oct. 24, 2014

(65) Prior Publication Data

US 2015/0041896 A1    Feb. 12, 2015

Related U.S. Application Data

(62) Division of application No. 12/099,175, filed on Apr. 8, 2008, now Pat. No. 8,921,190.

(51) Int. Cl.
| | |
|---|---|
| *H01L 29/76* | (2006.01) |
| *H01L 29/78* | (2006.01) |
| *H01L 29/417* | (2006.01) |
| *H01L 29/66* | (2006.01) |
| *H01L 29/08* | (2006.01) |
| *H01L 29/423* | (2006.01) |

(52) U.S. Cl.
CPC ...... *H01L 29/7834* (2013.01); *H01L 29/0847* (2013.01); *H01L 29/41783* (2013.01); *H01L 29/423* (2013.01); *H01L 29/66575* (2013.01)

(58) Field of Classification Search
CPC .......... H01L 27/1203; H01L 29/78618; H01L 29/665; H01L 29/0847; H01L 29/41733; H01L 2924/13091; H01L 29/41783; H01L 29/4232; H01L 29/66477; H01L 29/78624
See application file for complete search history.

(56) References Cited

U.S. PATENT DOCUMENTS

| | | | |
|---|---|---|---|
| 5,405,795 A | 4/1995 | Beyer et al. | |
| 5,953,605 A | 9/1999 | Kodama | |
| 6,137,149 A | 10/2000 | Kodama | |

(Continued)

*Primary Examiner* — Meiya Li
(74) *Attorney, Agent, or Firm* — Michael Le Strange; Andrew M. Calderon; Roberts Mlotkowski Safran Cole & Calderon, P.C.

(57) ABSTRACT

A semiconductor structure and method of manufacture and, more particularly, a field effect transistor that has a body contact and method of manufacturing the same is provided. The structure includes a device having a raised source region of a first conductivity type and an active region below the raised source region extending to a body of the device. The active region has a second conductivity type different than the first conductivity type. A contact region is in electric contact with the active region. The method includes forming a raised source region over an active region of a device and forming a contact region of a same conductivity type as the active region, wherein the active region forms a contact body between the contact region and a body of the device.

20 Claims, 12 Drawing Sheets

(56) References Cited

U.S. PATENT DOCUMENTS

| | | | |
|---|---|---|---|
| 6,323,525 | B1 | 11/2001 | Noguchi et al. |
| 6,403,482 | B1 * | 6/2002 | Rovedo ............... H01L 29/0653 257/E21.431 |
| 6,455,396 | B1 | 9/2002 | Lee |
| 6,466,082 | B1 | 10/2002 | Krishnan |
| 6,537,885 | B1 | 3/2003 | Kang et al. |
| 6,664,150 | B2 | 12/2003 | Clark, Jr. et al. |
| 6,812,105 | B1 | 11/2004 | Dokumaci et al. |
| 6,914,303 | B2 | 7/2005 | Doris et al. |
| 6,958,516 | B2 | 10/2005 | Wong |
| 6,975,001 | B2 | 12/2005 | Koh et al. |
| 7,084,462 | B1 | 8/2006 | Warnock et al. |
| 7,208,803 | B2 | 4/2007 | Ting |
| 7,227,224 | B2 | 6/2007 | Ko et al. |
| 2005/0242399 | A1 | 11/2005 | Huang |
| 2006/0022266 | A1 | 2/2006 | Messenger et al. |
| 2006/0049467 | A1 | 3/2006 | Lim et al. |
| 2006/0189053 | A1 | 8/2006 | Wang et al. |
| 2009/0032868 | A1 | 2/2009 | Chen et al. |

\* cited by examiner

Simulated IV Curves

FIELD EFFECT TRANSISTOR AND METHOD OF MANUFACTURE

FIELD OF THE INVENTION

The invention relates to a semiconductor structure and method of manufacture and, more particularly, to field effect transistors having a body contact and method of manufacturing the same.

BACKGROUND DESCRIPTION

Field Effect Transistors (FETs) and High Voltage (HV) FETs require specially tailored well doping profiles and low well contact resistance. However, well contacts for thin-film silicon on insulator (SOI) are difficult to implement and typically have large parasitic capacitance, which limits device performance. The well contacts for thin-film SOI also typically have large resistance, which limits the robustness to high voltages.

More specifically, in standard SOI FETs, the source and drain are formed in a layer of silicon disposed on the silicon oxide-insulating layer. In SOI technology, if the body of an SOI transistor device floats, e.g., is not connected to a voltage source, the device characteristics and threshold voltage may vary with the switching history which the device experiences in actual operation. To cure such deficiencies, it is known to form a contact to the body of the device in order to allow the body to be connected to a voltage source. This may be done by use of a vertical gate line; however, known contact bodies have high resistance, which impart deleterious characteristics to the device.

By way of example, in known body contacts, the body contact is doped in the same concentration as that of the active region of a semiconductor device. This doping can affect many performance characteristics of the semiconductor device. For example, if the body doping concentration is increased in order to reduce the body-contact resistance, the threshold voltage of the device will increase in correspondence. Accordingly, under certain circumstances, a semiconductor device, with increased body doping to reduce body contact resistance, will tend to require higher gate voltage to conduct and to conduct less for a given voltage applied to the gate.

Yet another problem for body-contacted devices is the potential for the existence of a "sneak path" for current between the source and the drain adjacent to the device channel and beneath the region of the gate electrode which provides isolation between the body contact and the source/drain regions. When body doping is too low beneath this isolation region and adjacent to the source and drain regions, a parasitic channel can form between the source and drain which degrades operation of the device. This sneak path can be particularly exacerbated when the body-contacted device is operated at voltages, with respect to the substrate voltage, that tend to invert the body, providing a 'back-gating' action on this sneak path. Thus it is desirable to achieve low resistance the body contact, and to eliminate sneak paths, while maintaining low threshold voltage of the device.

Accordingly, there exists a need in the art to overcome the deficiencies and limitations described hereinabove.

SUMMARY OF THE INVENTION

In a first aspect of the invention, a semiconductor device is provided. The semiconductor device comprises a device having a raised source region of a first conductivity type and an active region below the raised source region extending to a body of the device. The active region has a second conductivity type different than the first conductivity type. A contact region is in electric contact with the active region.

In embodiments, the contact region is in electric contact with the body of the device. The contact region is of a different conductivity type than the first conductivity type. The device further comprises a raised drain region. A silicide metal is in contact with the device, the contact region and the raised drain region. Metal contacts are in electric contact with the silicide metal. A silicide metal is in contact with the device, the contact region, the raised source region and a raised drain region. The metal contacts are in electric contact with the silicide metal. An isolation structure is between the silicide metal of the raised source region and the contact region, thereby forming a symmetric FET with an isolated body contact. The active region and the contact region form a symmetric body contact. The first conductivity type reaches only partly through the active region below the raised source region. The raised source region is approximately 100 nm. The active region is a p-doped region or an n-doped region. A drain region is made from a same material which forms the active region. The drain region is a lightly doped drain. The first conductivity type reaches only partly through the active region below the raised source region. An n-type doped region is adjacent to the drain region, on a side opposing the raised source region. A silicide metal is in contact with the device, the contact region, the raised source region and the n-type doped region, and metal contacts in electric contact with the silicide metal. An isolation structure is between the silicide metal of the raised source region and the contact region.

In a second aspect of the invention, a semiconductor device comprises a device having a body and an active region in contact with the body of the device. A raised source region of the device has a conductivity type which extends only partly within the active region.

In embodiments, the active region is a p-doped region or an n-doped region. A doped contact region is in electrical contact with the active region, on a side of the raised source region. Metal silicide and contacts connect to at least the raised source region and the p-region contact. An isolation structure is between the silicide on the raised source region and the doped contact region, thereby forming an isolated body contact region. The active region is substantially symmetric about the device. A lightly doped drain region is formed in the active region, and an n-type region on a side of the lightly doped drain region.

In a third aspect of the invention a method is provided for forming a semiconductor structure. The method comprises forming a device over an active region and forming a raised structure at least over a source side of the active region. The raised structure is doped with a first conductivity type at a sufficient energy to form a raised source region, while maintaining a body contact comprising at least a portion of the active region.

In embodiments, the active region is a p-doped region and an n-doped region. The method further comprises forming a contact region in electrical contact with the active region, on a side of the raised source region. The contact region is formed as a p-type region. The method further comprises forming a high voltage lightly doped drain. The method further comprises protecting the high voltage lightly doped drain during the doping of the raised structure. The method further comprises doping an area adjacent to the high voltage lightly doped drain during the doping of the raised structure.

The method further comprises: forming a silicide metal in contact with the device, a contact region and the raised source region; forming metal contacts in electric contact with the silicide metal; and providing an isolation structure between the silicide metal of the raised source region and the contact region, thereby forming a symmetric FET with an isolated body contact.

In a fourth aspect of the invention, a method of forming a semiconductor is provided. The method comprises the steps of forming a raised source region over an active region of a device and forming a contact region of a same conductivity type as the active region. The active region forms a contact body between the contact region and a body of the device.

BRIEF DESCRIPTION OF THE DRAWINGS

The foregoing aspects and advantages of the invention will be better understood from the following detailed description of embodiments of the invention with reference to the drawings, in which.

DETAILED DESCRIPTION OF EMBODIMENTS OF THE INVENTION

The invention relates to a semiconductor structure and method of manufacture, and more particularly to a field effect transistor (FET) having a body contact and method of manufacturing the same. More specifically, the present invention is directed to a semiconductor device (e.g., FET) formed on a substrate with an active silicon layer of a first conductivity type on a buried dielectric layer (e.g., SOI substrate). The FET includes at least one raised region such that a portion of the active silicon layer can extend under the at least one raised region to couple to the body of the FET. The raised region is grown silicon, an amorphous layer of silicon or a polysilicon layer which, in embodiments, forms part of a source region (e.g., raised source region). By introducing a raised region, a body contact is provided from the side of the raised region which allows accurate control of the electric bias conditions under the gate region of the device. Also, in embodiments, the drain region can be optimized for high voltage tolerance. Alternatively, the drain region can be raised and, if desired, the body contact could be isolated from the source for a symmetric device behavior having, for example, a four-terminal biasing.

Figure 1:
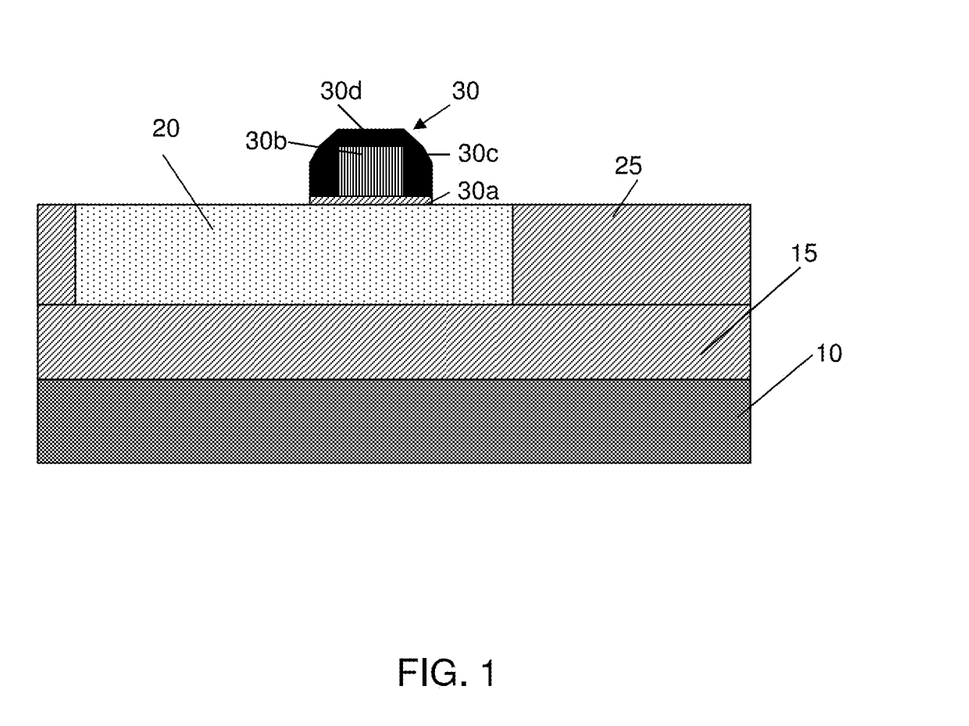
FIG. 1 is a starting structure for a field effect transistor (FET) with a body contact in accordance with a first aspect of the present invention.

FIG. 1 shows a starting structure of a symmetric FET in accordance with the invention. In particular, FIG. 1 shows a buried oxide 15 formed on silicon wafer 10. The buried oxide 15 is, for example, about 150 nm in thickness, but in embodiments can extend to approximately 1 micron. It should be recognized, though, that the dimensions of the buried oxide, as well as other structures described herein should not be considered a limiting feature of the invention and are provided herein for illustrative purposes.

Still referring to FIG. 1, an active region 20 and shallow trench isolation (STI) regions 25 are formed over the buried oxide 15. In embodiments, the active region 20 is formed of doped silicon using conventional processing methods. For example, in one embodiment, a silicon layer is placed on the buried oxide 15 to a thickness of about 20 nm to 1 micron. The silicon layer is then subjected to a conventional lithographic process, e.g., photoresist and etching process, to form trenches in order to backfill in the STI regions 25 with oxide. The silicon material is doped with a p-type dopant, e.g., boron, to form the active region 20. In embodiments, the active region 20 forms a symmetric p-well region. This process also forms the STI regions 25.

In embodiments, the active region 20 is doped with boron at a sufficient energy and for a sufficient time to reach to the buried oxide 15. It should be understood, though, that the doping of the active region 20 with boron might be tailored depending on the particular application. As such, in other applications, the energy may be sufficient to extend the active region 20 through only a portion of the silicon layer. In alternate embodiments, those of ordinary skill in the art would appreciate that the active region can also be doped with an n-type dopant such as, for example, arsenic or phosphorous. As such, it should be appreciated that the present invention contemplates the opposite type doping to form other device types. However, in the following discussion for illustrative purposes, the use of a p-type dopant to form n-channel FETs will be discussed.

A conventional device (e.g., FET) 30 is formed on the active region 20. The device 30 includes a gate oxide 30a formed on the active region 20. A metal layer 30b is formed on the gate oxide 30, which acts as the gate conductor. The metal layer 30b may be, for example, a suitable polysilicon layer. Sidewalls 30c are formed on the gate conductor 30 and a cap 30d is formed over the polysilicon layer. The sidewalls 30c and cap 30d may be formed of any suitable dielectric material.

Figure 2:
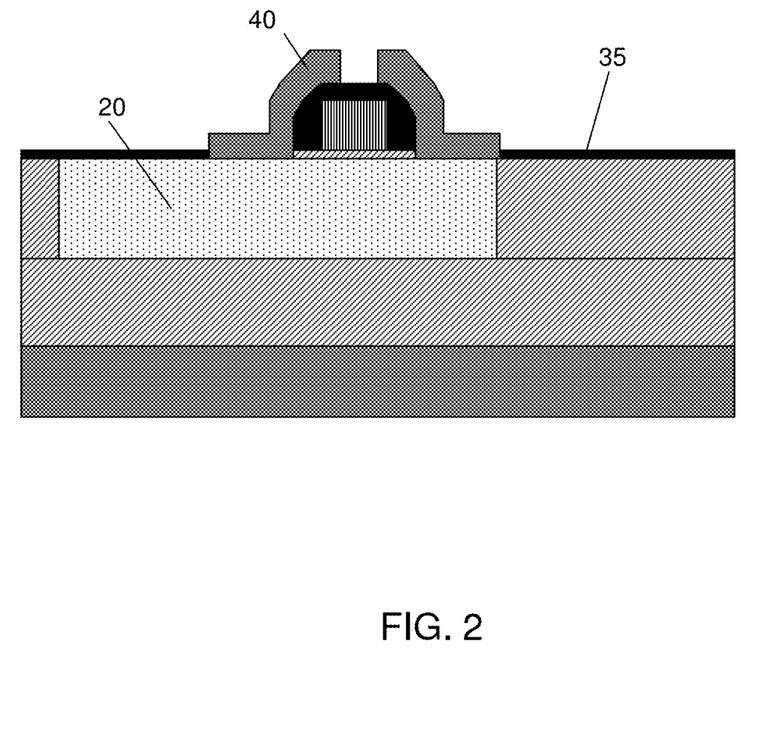
FIGS. 2 and 3 show intermediate structures and methods of manufacturing in accordance with the first aspect of the present invention.

In FIG. 2, any suitable etch stop layer 35 is formed, e.g., deposited and patterned, over the entire structure of FIG. 1. The etch stop layer 35 may be a dielectric layer of silicon nitride or silicon dioxide, for example. In embodiments, etch stop layer 35 is about 30 nm in thickness. A conventional lithographic process is used to remove portions of etch stop layer 35 over the device 30 and portions of the active region 20. In embodiments, the conventional lithographic process includes depositing a photoresist layer over the etch stop layer 35, and exposing the photoresist layer to a light source to open a portion of the photoresist layer over desired areas in the etch stop layer 35. In embodiments, the opening is formed symmetrically about the device 30.

A silicon layer is deposited and patterned in the opening to form a raised region 40. In embodiments, the raised region 40 is about 100 nm in thickness and will form a raised source region and a raised drain region. The raised region 40 can be grown silicon, an amorphous layer of silicon or a polysilicon. By forming the raised region 40, an underpass connection can be formed in the active region 20 under the source region (and/or drain region) to couple a body region of the device to a doped contact region, as discussed in greater detail below. Those of skill in the art should recognize that the thickness of the raised region 40 could be tailored to provide different underpass connection heights.

Figure 3:
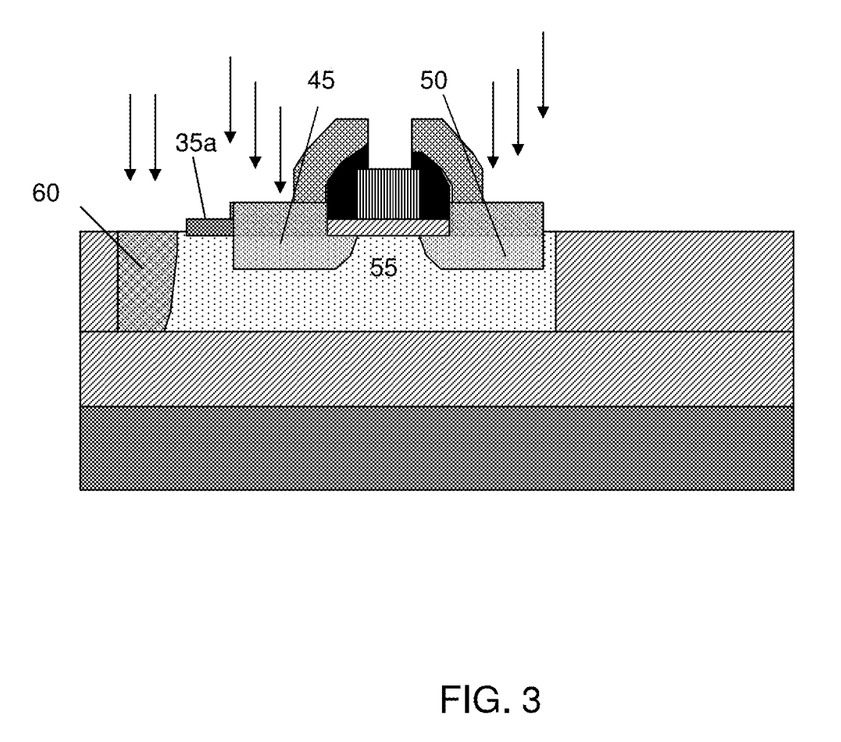

In FIG. 3, etch stop layer 35 is removed (e.g., stripped) over portions of the structure of FIG. 2 using conventional processes such as, for example, a wet or dry etching process. In one embodiment, a portion 35a of etch stop layer 35 remains over a portion of the active region, e.g., on a side of the raised region 40 near a source region. In another embodiment, the etch stop layer 35 entirely is removed from the structure. The etching process also removes exposed portions of the cap 30d.

FIG. 3 further shows the formation of the source region 45 and drain region 50 using conventional implantation (dosing) processes. In embodiments, the raised region 40 forms at least part of the source region 45 and drain region 50. Accordingly, the source region and drain region are partly raised above the surface of the structure. In accordance with the invention, the raised region 40 is of sufficient thickness such that the dopant forming at least the source region 45 extends only within a portion of the active region 20. That is, the raised region 40 prevents the dopant (which forms the source region 45) from extending entirely through the active region 20 to the buried oxide layer 15. In this way, a portion of the p-well (active region) 20 under the source region 45 will remain free of n-type dopants and, as such, can act as a connection between a doped body contact region 60 and the body region 55. Those of skill in the art should recognize that the implantation process could be tailored to provide different underpass connection heights. Also, depending on the thickness of the raised region 40 and the dosage used during the implantation process, the source region could be formed entirely from the raised region.

In embodiments, the doped body contact region 60 is formed in the active region 20, on a side of the source region 45. The doped region is a p-type doped region. As the raised source region 45 does not reach to the underlying buried oxide 15, due to the formation of the raised region, an underpass connection is formed under the source region to couple a body region 55 (of the device) to the doped body contact region 60. In this way, the p-type doped body contact region 60 is in electrical contact with the body region 55, via the active region 20 under the device 30.

Figure 4:
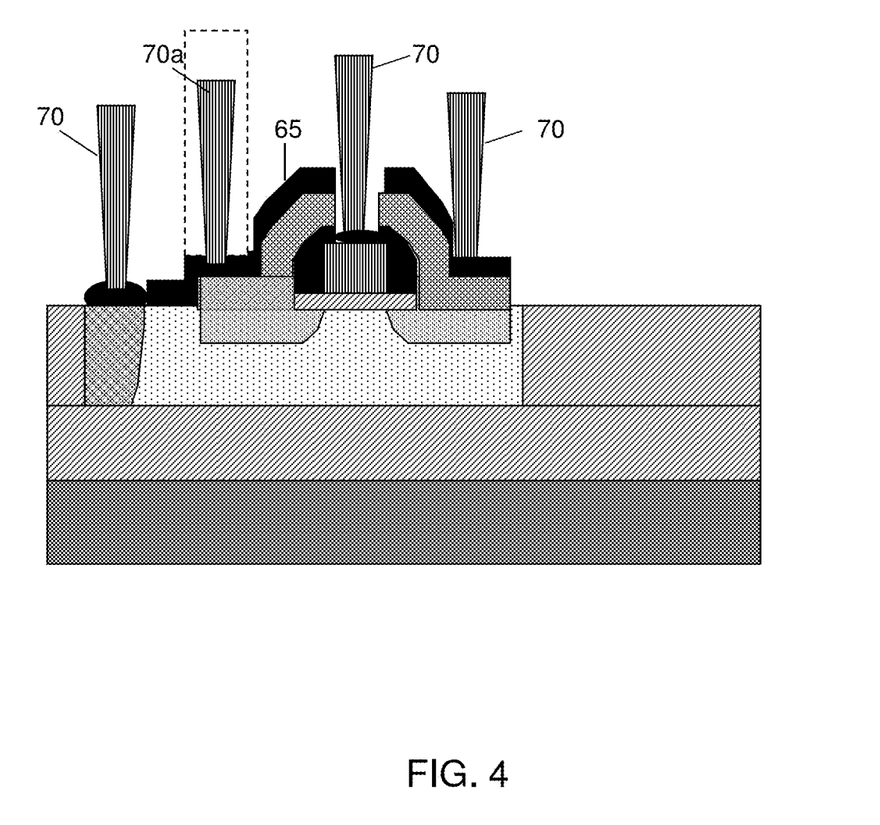
FIG. 4 shows a final structure and methods of manufacturing in accordance with the first aspect of the present invention.

In FIG. 4, a metal silicide 65 is formed over the structure of FIG. 3. More specifically, metal silicide 65 is formed over the raised source region 45 and the drain region 50, the p-type doped body contact region 60 and the device 30. Contacts 70 are formed over the raised drain region 50 and p-type doped body contact region 60, using conventional processes. An optional contact 70a may be formed over the raised source region 45. As the contacts 70 are formed in conventional methods, known to those of skill in the art, a discussion herein is not necessary for one of skill to practice the invention and is thus omitted. In the structure of FIG. 4, the junction between the p-type doped body contact region 60 and the raised source region 45 is shorted. This forms a symmetric FET with a shared body contact.

Figure 5:
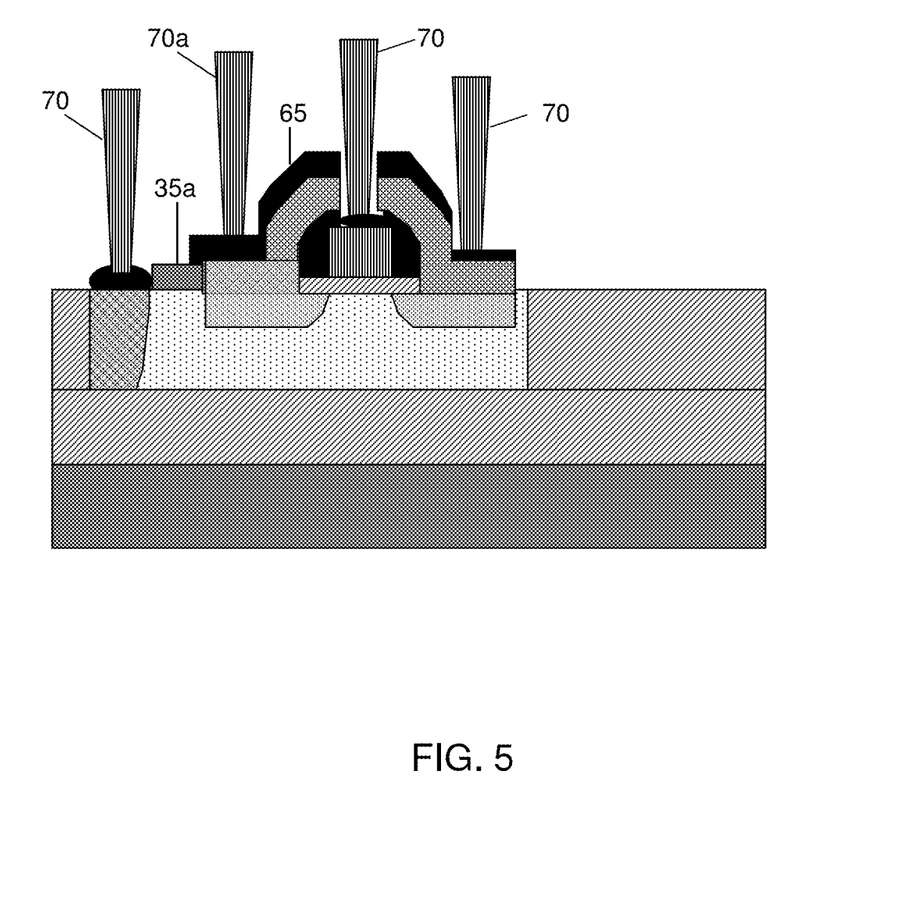
FIG. 5 shows an alternative final structure and methods of manufacturing in accordance with the first aspect of the present invention.

In the embodiment of FIG. 5, etch stop layer 35 between the raised source region 45 and the p-type doped body contact region 60 is not etched (stripped). As such, etch stop layer 35 isolates the raised source region 45 from the p-type doped body contact region 60. This forms a symmetric FET with an isolated body contact.

Figure 6:
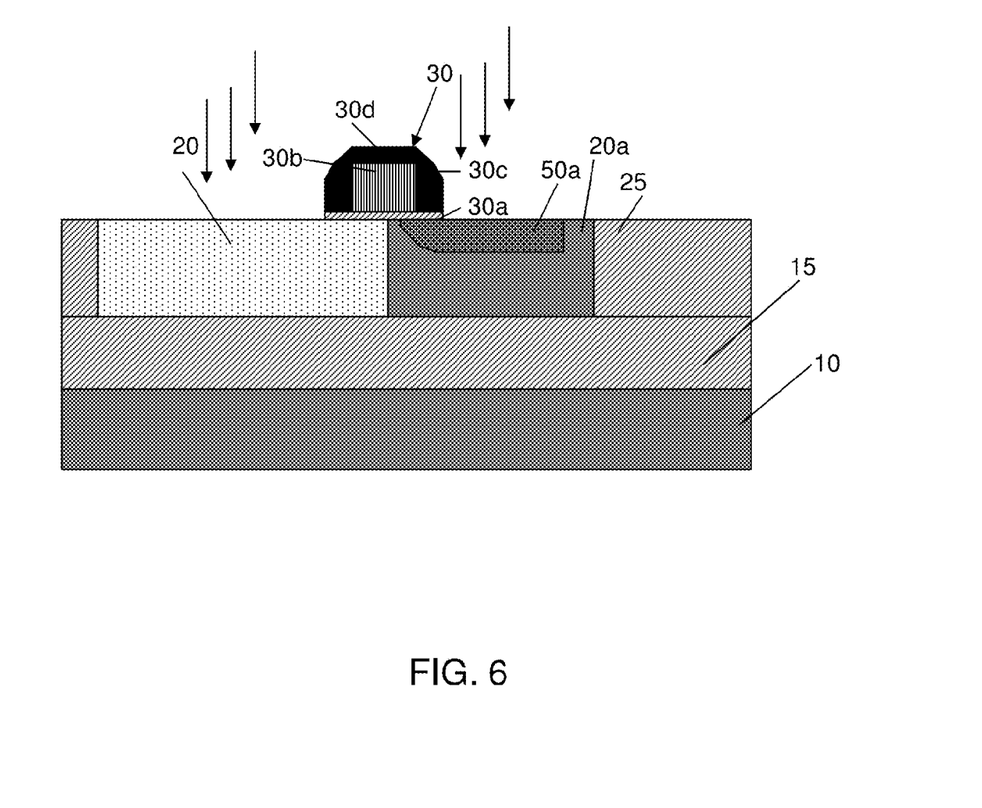
FIG. 6 is a starting structure for a high voltage field effect transistor (HV FET) with a body contact in accordance with a second aspect of the present invention.

FIG. 6 shows a starting structure of a high voltage FET (HV FET) in accordance with a second aspect of the invention. In particular, FIG. 6 shows a buried oxide 15 on a silicon wafer 10. The buried oxide 15 is, for example, about 150 nm in thickness, but in embodiments can extend to approximately to 1 micron. Again, it should be recognized that the dimensions of the buried oxide, as well as other structures described herein should not be considered a limiting feature of the invention and are provided herein for illustrative purposes.

Still referring to FIG. 6, an active region 20 and STI regions 25 are formed over the buried oxide 15. In embodiments, the active region 20 is formed of doped silicon using conventional processing methods. For example, in one embodiment, a silicon layer is placed on the buried oxide 15 to a thickness of about 20 nm to 1 micron. The silicon layer is then subjected to a conventional lithographic process, e.g., photoresist and etching process, to form trenches in order to backfill in the STI regions 25 with oxide. The silicon material is doped with a p-well type dopant, e.g., boron, to form the active region 20. In embodiments, the active region 20 forms an asymmetric p-well region.

In this embodiment, the active region 20 is doped using a p-type dopant to form the basis of the HV FET. Specifically, the active region 20 is doped with boron at a sufficient energy and for a sufficient time to reach to the buried oxide 15 in concentration and distribution optimized for high voltage operation of the HV FET. Again, it should be understood that the doping of the active region 20 with boron might be tailored depending on the particular application. As such, in other applications, the energy may be sufficient to extend the active region 20 through only a portion of the silicon layer.

The silicon material, in embodiments, is protected over the drain region of the structure and, as such, is not additionally doped in this region. The drain region is formed in a subsequent processing step as described below. In this way, portion 20a on the drain region side of the structure is differently doped than that of the active region 20, thereby forming an asymmetric structure.

A conventional device (e.g., FET) 30 is formed on the active region 20. The device 30 includes a gate oxide 30a formed on the active region 20. A metal layer 30b is formed on the gate oxide 30, which acts as the gate conductor. The metal layer 30b may be, for example, a suitable polysilicon layer. Sidewalls 30c are formed on the gate conductor 30 and a cap 30d is formed over the polysilicon layer. The sidewalls 30c and cap 30d may be formed of any suitable dielectric material.

Also, in the embodiment of FIG. 6, a Lightly Doped Drain (LDD) implant is provided to form the drain region 50a. As should be understood by those of skill in the art, LDD is a part of the drain engineering strategy in very small geometry metal oxide semiconductor/complementary metal oxide semiconductor (MOS/CMOS) transistors, which are designed to control drain-substrate breakdown and minimize hot-carrier effects. The reduced doping gradient between drain and the channel lowers the electric field in the channel in the vicinity of the drain. The LDD implant can extend to any depth within the drain region, depending on a particular application.

Figure 7:
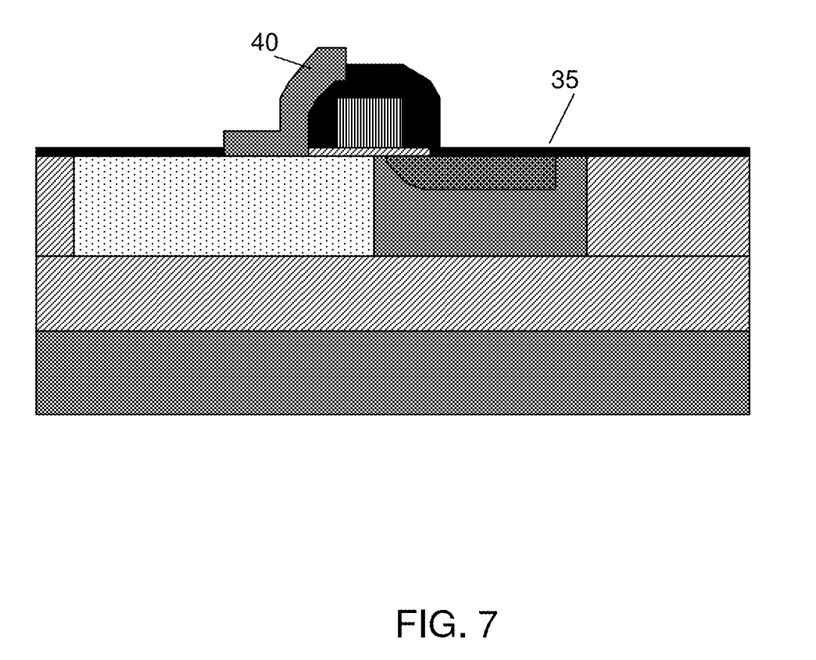
FIGS. 7 and 8 show intermediate structures and methods of manufacturing in accordance with the second aspect of the present invention.

In FIG. 7, any suitable etch stop layer 35 is formed, e.g., deposited and patterned, over the entire structure of FIG. 6. The etch stop layer 35 may be a dielectric layer of silicon nitride or silicon dioxide, for example. In embodiments, etch stop layer 35 is about 30 nm in thickness. A conventional lithographic process is used to remove portions of etch stop layer 35 over the device 30 and portions of the active region 20. In embodiments, the conventional lithographic process includes depositing a photoresist layer over the etch stop layer 35, and exposing the photoresist layer to a light source to open a portion of the photoresist layer over desired areas in the etch stop layer 35. In embodiments, the opening is formed asymmetrically about the device 30, e.g., over the source region as shown in FIG. 7.

Still referring to FIG. 7, a silicon layer is deposited in the opening to form a raised region 40. In embodiments, the raised region 40 is about 100 nm in thickness and will form a raised source region. The raised region 40 can be grown silicon, an amorphous layer of silicon or a polysilicon. By forming the raised region 40, an underpass connection can be formed under the source region to couple a body region of the device to a doped region, as discussed in greater detail below. Again, those of skill in the art should recognize that the thickness of the raised region 40 could be tailored to provide different underpass connection heights.

Figure 8:
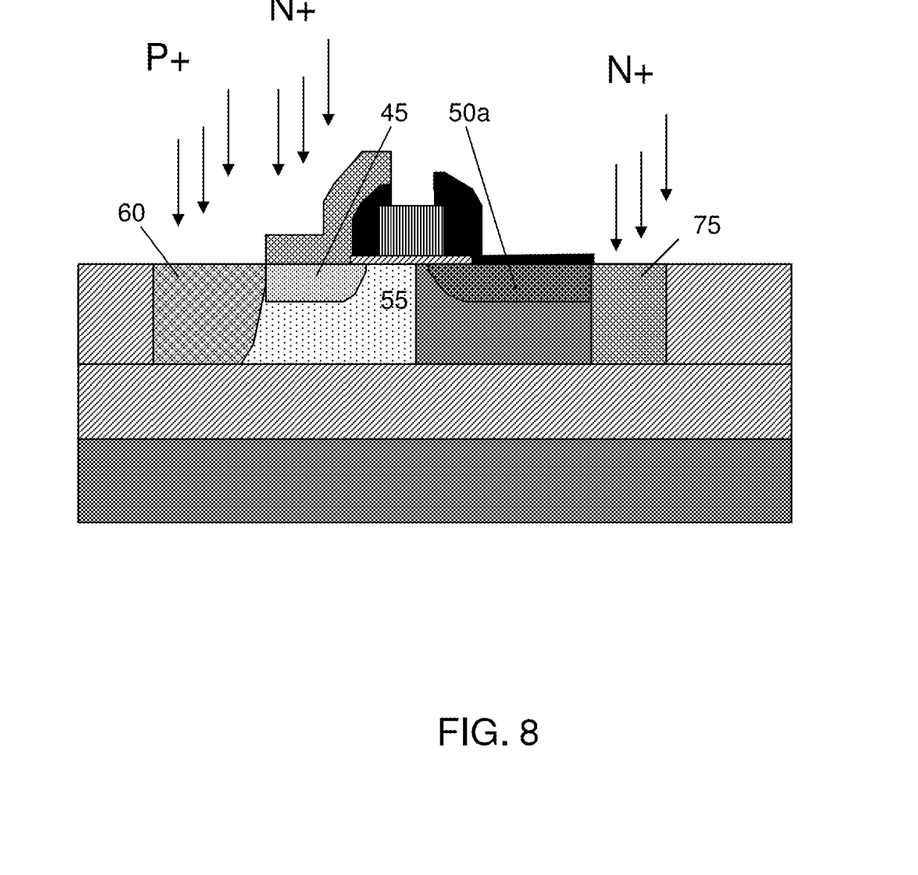

In FIG. 8, etch stop layer 35 is removed (e.g., stripped) over portions of the structure of FIG. 7, including over the active region 20 and portion 20a of the undoped silicon. The removal (stripping) process also removes the cap 30d over the device. In embodiments, etch stop layer 35 and cap 30d are removed using conventional lithographic processes, known to those of skill in the art. In one embodiment, etch stop layer 35 is not removed over the drain region 50a, in order to provide protection during subsequent doping and silicide processes.

FIG. 8 further shows the formation of the source region 45 using conventional implantation processes. As shown in FIG. 8, the source region 45 is formed at least partly from the raised region 40 and, as such, a source region is raised above a surface of the structure. In embodiments, the raised region 40 is of sufficient thickness such that the dopant, which forms the source region, extends only within a portion of the active region 20. That is, the raised region 40 ensures that the source region 45 does not extend entirely through the active region 20 to the buried oxide 15. In this way, a portion of the p-well (active region) 20 under the source region 45 will act as a connection between a doped body contact region 60 and the body region 55.

Those of skill in the art should recognize that implantation process could be tailored to provide different underpass connection heights. Also, depending on the thickness of the raised region 40 and the dosage used during the implantation process, the source region could be formed entirely from the raised region.

In embodiments, the doped body contact region 60 is formed in the active region 20, on a side of the source region 45. The doped region is a p-type doped region. As the raised source region 45 does not reach to the underlying buried oxide 15, due to the formation of the raised region, an underpass connection is formed under the raised source region 45 to couple a body region 55 (of the device) to a p-type doped body contact region 60. In this way, the p-type doped body contact region 60 is in electrical contact with the body region 55, via the active region 20 under the device 30 (e.g., body region 55).

In embodiments, etch stop layer 35 protects the drain region 50a during the doping of the source region 45. However, the portion of unprotected-undoped silicon is subject to the suitable n-type dopant during the implantation process of the source region 45. This forms an n-type doped drain contact region 75, preferably to the underlying buried oxide 15.

Figure 9:
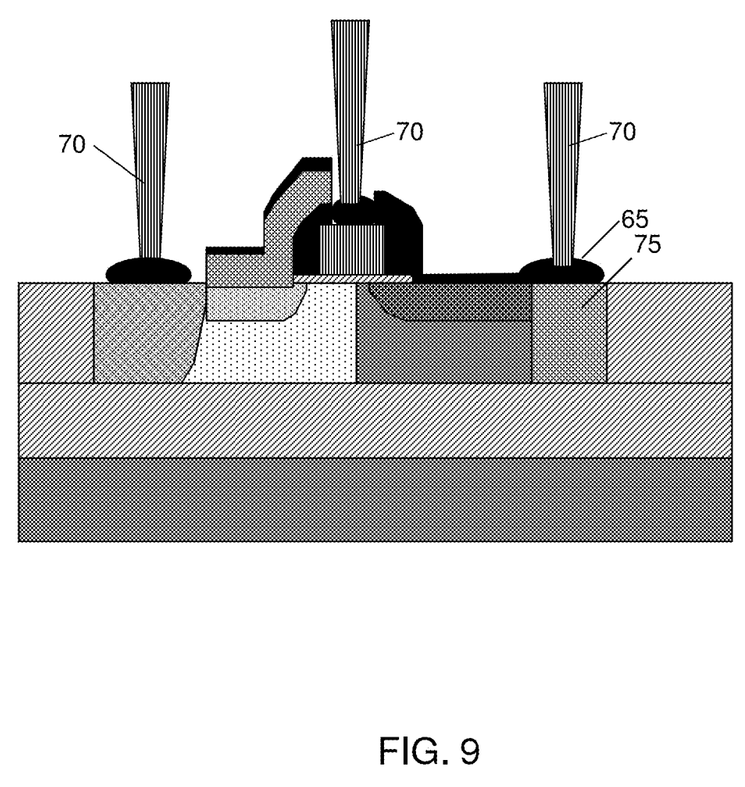
FIG. 9 shows a final structure and methods of manufacturing in accordance with the second aspect of the present invention.

In FIG. 9, a metal silicide 65 is formed over the structure of FIG. 8. More specifically, metal silicide 65 is formed over the p-type doped body contact region 60, the device 30 and the n-type doped drain contact region 75. The metal silicide 65 is also formed on the raised source region 45. Contacts 70 are formed on the metal silicide in areas of the device 30, the p-type doped body contact region 60 and the n-type doped drain contact region 75, using conventional methods. In embodiments, etch stop layer 35 also protects the drain region 50a from the formation of silicide on the drain region 50a. The structure of FIG. 9 is representative of a HV FET with a shared body contact.

Figure 10:
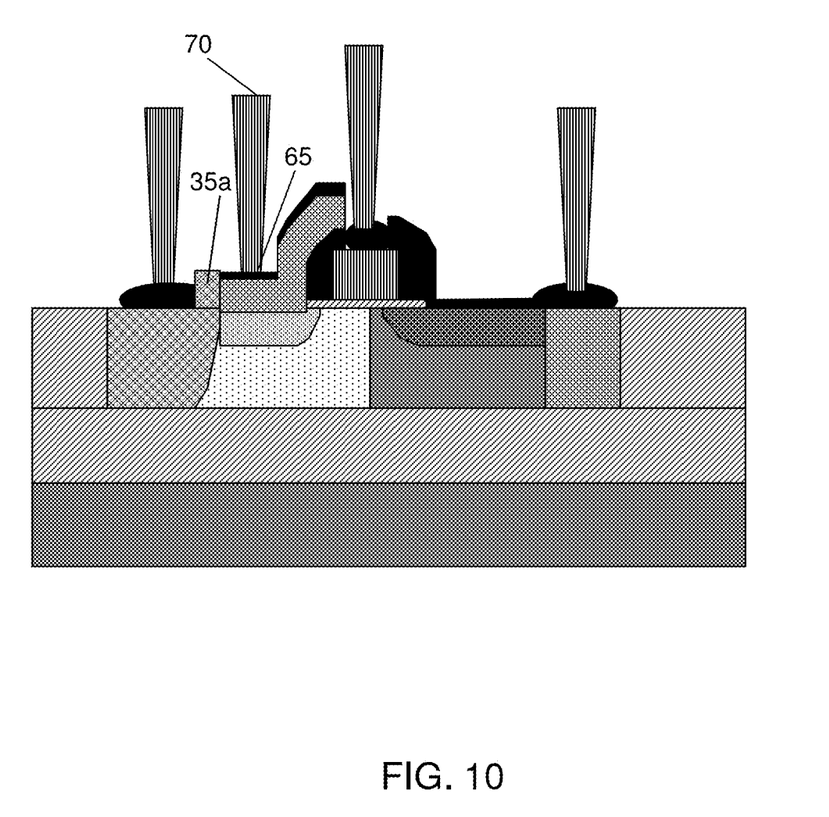
FIG. 10 shows an alternative final structure and methods of manufacturing in accordance with the second aspect of the present invention.

In FIG. 10, an isolated HV 1ET is formed in accordance with the invention. In this embodiment, etch stop layer 35 is provided between the raised source region 45 and the p-type doped body contact region 60. The metal silicide 65 is formed over the raised source region 45 and a contact 70 is formed thereon. In this embodiment, the etch stop layer 35 isolates the raised source region 45 and the p-type doped body contact region 60 to form an isolated body contact HV FET.

Figure 11:
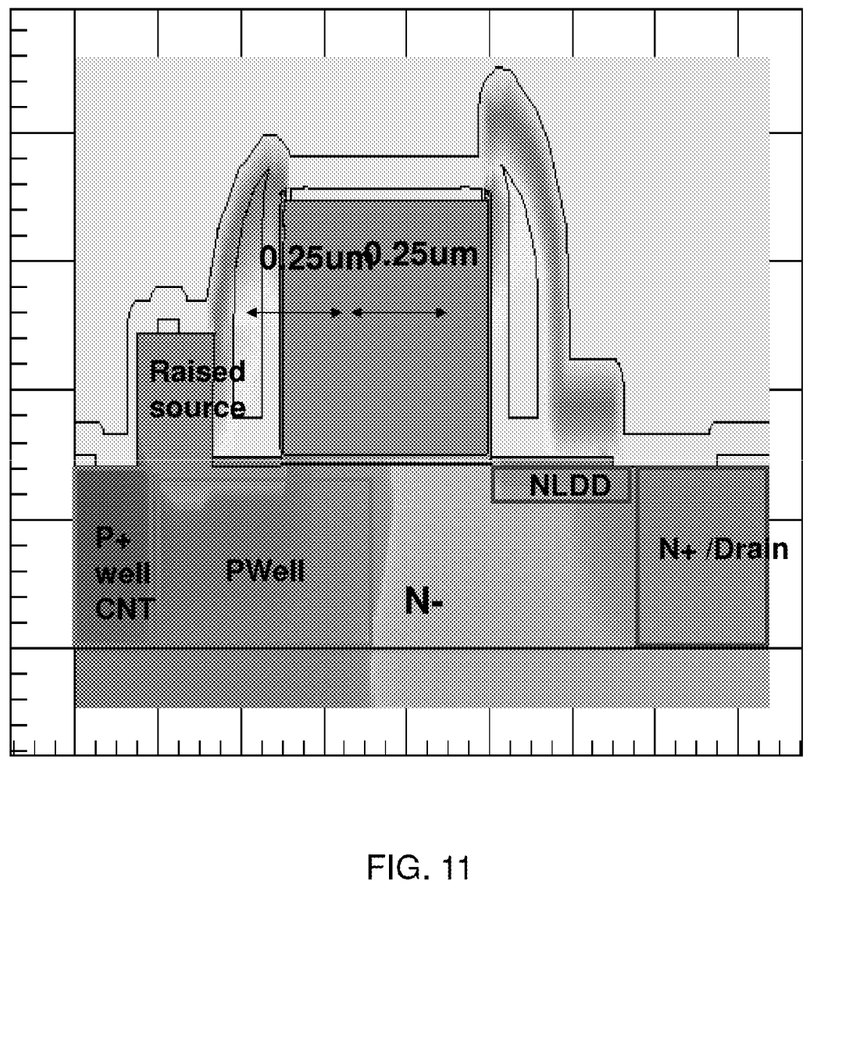
FIG. 11 shows a simulated doping profile of an HV FET in accordance with the invention.

FIG. 11 shows a simulated doping profile of an HV FET in accordance with the invention. (A similar profile can also be simulated for the symmetric FET in accordance with the first aspect of the invention.) As shown in this simulated doping profile, the raised region forms a raised source region, preventing n-type doping to extend to the underlying oxide layer. That is, as should now be understood by those of skill in the art in view of the above discussion, the raised region is of sufficient thickness to prevent the n-type doping to penetrate to the underlying oxide layer. Also, due to the formation of the p-well (formed from the active region), an underpass or connection is provided to electrically connect the p-typed doped region with the body contact of the device.

Figure 12A:
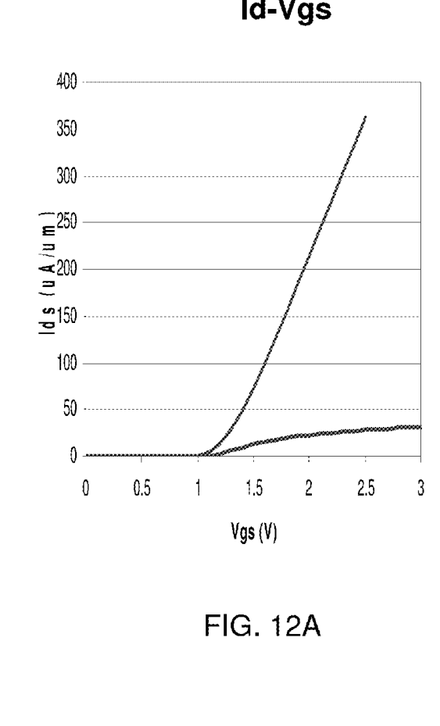
FIGS. 12a and 12b show performance graphs in accordance with the invention.
Figure 12B:
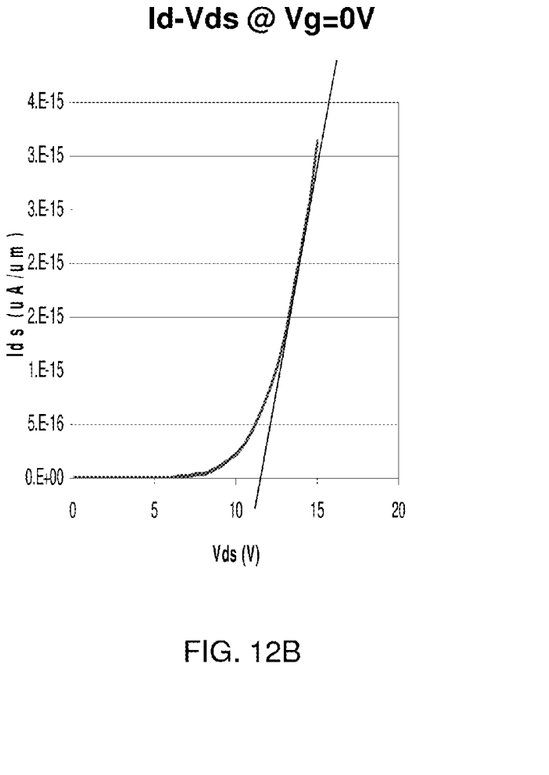

FIGS. 12a and 12b show performance graphs in accordance with the invention. More specifically, FIGS. 12a and 12b show simulated IV curves for a HV FET fabricated in accordance with the invention. (FIGS. 12a and 12b can equally represent a simulated IV curves for a symmetric FET fabricated in accordance with the invention.) FIG. 12a shows a high current and small voltage at turn on of the HV FET. FIG. 12b shows a small current and high voltage at turn off of the HV FET.

The resulting integrated circuit can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of exemplary embodiments, those skilled in the art will recognize that the invention can be practiced with modifications and in the spirit and scope of the appended claims.

What is claimed is:

1. A semiconductor device, comprising:
   a field effect transistor device having a raised source region of a first conductivity type;
   an active region below the raised source region extending to a body of the field effect transistor device, the active region having a second conductivity type different than the first conductivity type;
   a gate oxide on the active region;
   a gate conductor on the gate oxide;
   a contact region in electric contact with the active region; and
   an etch stop layer on the body of the field effect transistor device and between the raised source region and the contact region of the field effect transistor device,
   wherein the active region comprises an underpass connection under the raised source region between the contact region and the body of the field effect transistor device such that the contact region is coupled to the body of the field effect transistor device, and
   the raised source region is over sidewalls and a portion of a top surface of the gate conductor.

2. The semiconductor device of claim 1, wherein the contact region is in electric contact with the body of the field effect transistor device.

3. The semiconductor device of claim 1, wherein the contact region is of a different conductivity type than the first conductivity type.

4. The semiconductor device of claim 1, wherein the field effect transistor device further comprises a raised drain region.

5. The semiconductor device of claim 4, further comprising a silicide metal in contact with the field effect transistor device, the contact region and the raised drain region.

6. The semiconductor device of claim 5, further comprising metal contacts in electric contact with the silicide metal.

7. The semiconductor device of claim 1, further comprising a silicide metal in contact with the field effect transistor device, the contact region, the raised source region and a raised drain region.

8. The semiconductor device of claim 7, further comprising metal contacts in electric contact with the silicide metal.

9. The semiconductor device of claim 7, wherein the etch stop layer is between the silicide metal of the raised source region and the contact region, thereby forming a symmetric FET with an isolated body contact.

10. The semiconductor device of claim 1, wherein the active region and the contact region form a symmetric body contact.

11. The semiconductor device of claim 1, wherein the first conductivity type reaches only partly through the active region below the raised source region.

12. The semiconductor device of claim 1, wherein the raised source region is approximately 100 nm and prevents a dopant from extending entirely through the underpass connection to a buried oxide layer under the active region.

13. The semiconductor device of claim 1, further comprising a drain region in a same material which forms the active region.

14. The device of claim 13, wherein the drain region is a lightly doped drain.

15. The device of claim 13, wherein the first conductivity type reaches only partly through the active region below the raised source region.

16. The device of claim 13, further comprising an n-type doped region adjacent to the drain region, on a side opposing the raised source region.

17. The device of claim 16, further comprising a silicide metal in contact with the device, the contact region, the raised source region and the n-type doped region, and metal contacts in electric contact with the silicide metal.

18. The device of claim 17, further comprising an isolation structure between the silicide metal of the raised source region and the contact region.

19. The device of claim 1, wherein the active region is directly on a buried oxide layer, a cap comprising dielectric material is directly on the gate conductor comprising a polysilicon layer, and the raised source region is directly on the cap.

20. The device of claim 19, wherein a top surface of the contact region is below a bottom surface of the gate oxide, the first conductivity type is n-type dopant, and the second conductivity type is p-type dopant.

* * * * *